US012658273B2

(12) United States Patent
Kerstetter et al.

(10) Patent No.: US 12,658,273 B2
(45) Date of Patent: Jun. 16, 2026

(54) SEMICONDUCTOR MEMORY DEVICE WITH PROCESSING-IN-MEMORY USING TEST CIRCUITRY

(71) Applicant: Micron Technology, Inc., Boise, ID (US)

(72) Inventors: Shadden Kerstetter, Kuna, ID (US); Raghukiran Sreeramaneni, Frisco, TX (US); Nevil N. Gajera, Meridian, ID (US); Chikara Kondo, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 18/789,680

(22) Filed: Jul. 31, 2024

(65) Prior Publication Data

US 2025/0118386 A1      Apr. 10, 2025

Related U.S. Application Data

(60) Provisional application No. 63/542,924, filed on Oct. 6, 2023.

(51) Int. Cl.
| | |
|---|---|
| *G11C 29/48* | (2006.01) |
| *G11C 7/10* | (2006.01) |
| *G11C 29/36* | (2006.01) |

(52) U.S. Cl.
CPC ............ *G11C 29/36* (2013.01); *G11C 7/1069* (2013.01); *G11C 7/1096* (2013.01); *G11C 2029/3602* (2013.01); *G11C 29/48* (2013.01)

(58) Field of Classification Search
CPC ......... G11C 29/48; G11C 29/00; G11C 29/02; G11C 29/04; G06F 11/10; G06F 11/22
See application file for complete search history.

(56) References Cited

U.S. PATENT DOCUMENTS

2021/0202328 A1* 7/2021 Kariya ................... G11C 29/48

* cited by examiner

*Primary Examiner* — Jason Lappas
(74) *Attorney, Agent, or Firm* — Dorsey & Whitney LLP

(57) ABSTRACT

Disclosed are methods, systems, and apparatuses for a memory device with test circuitry-based processing-in-memory (PIM). The memory device utilizes circuitry used to control, sequence, and/or perform test functions, found on a die of the memory device (e.g., an interface die and/or memory die), to perform PIM functions. For example, the memory device may utilize a memory built-in self-test (mBIST) automatic pattern generator (APG) for PIM sequencing. To control PIM operations, the mBIST APG may fetch and decode microcode instructions local to the die. The microcode instructions may be fetched from a read-only memory (ROM) and/or non-volatile memory. Microcode instructions to perform desired PIM operations may be written to the non-volatile memory by a host device coupled to the memory device.

20 Claims, 6 Drawing Sheets

500

SEMICONDUCTOR MEMORY DEVICE WITH PROCESSING-IN-MEMORY USING TEST CIRCUITRY

CROSS-REFERENCE TO RELATED APPLICATION(S)

The present application claims priority to U.S. Provisional Patent Application No. 63/542,924, filed Oct. 6, 2023, the disclosure of which is incorporated herein by reference in its entirety.

TECHNICAL FIELD

The present disclosure generally relates to a semiconductor memory device and, more specifically, relates to a memory device that provides processing-in-memory using test circuitry of the memory device.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read-only memory (ROM), dynamic RAM (DRAM), synchronous dynamic RAM (SDRAM), and others. Information is stored in various types of RAM by charging a memory cell to have different states. Improving RAM devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

Figure 1:
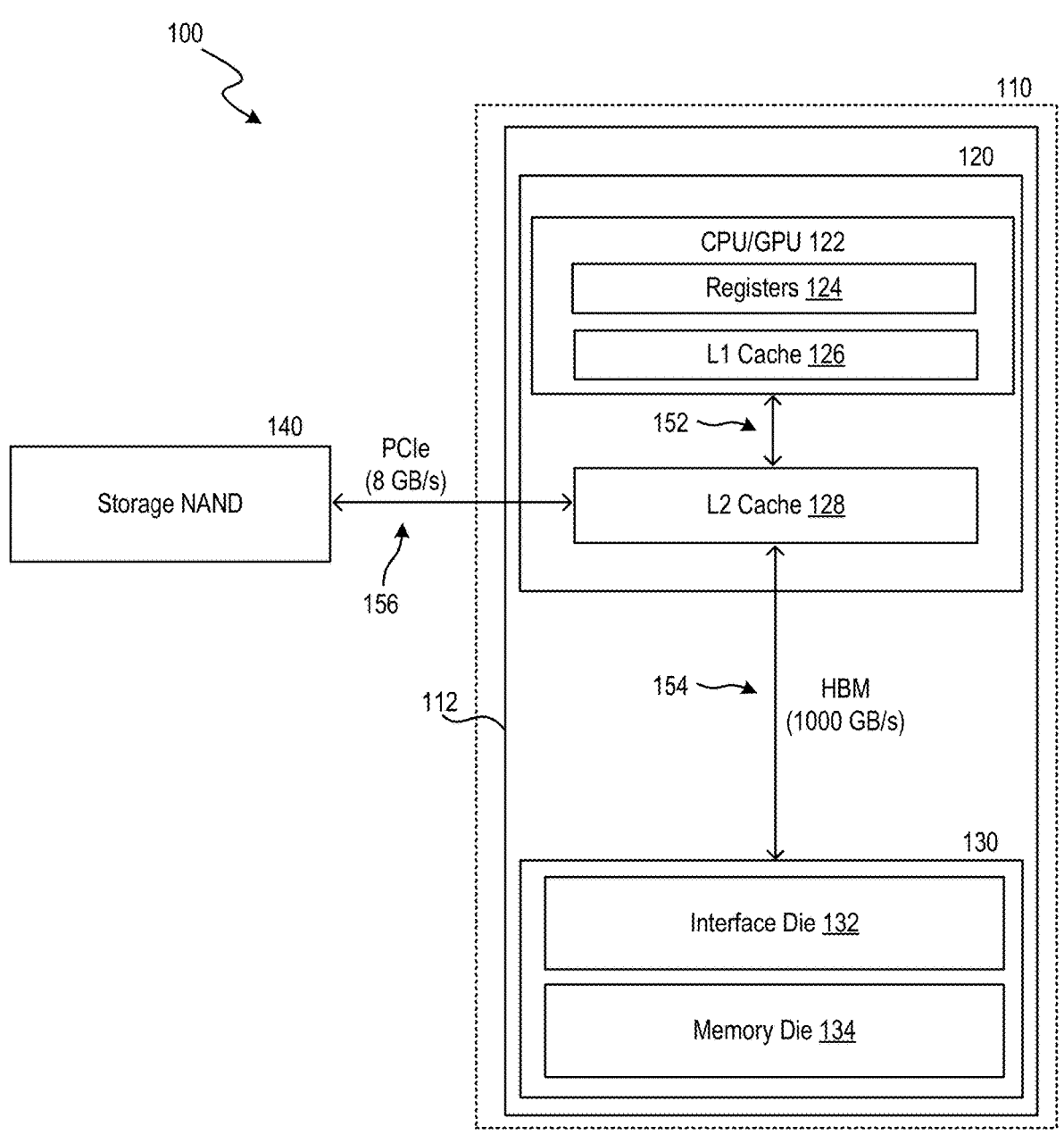
FIG. 1 is a schematic diagram illustrating an environment that incorporates a high bandwidth memory device with test circuitry-based processing-in-memory, configured in accordance with an embodiment of the present technology.

The drawings have not necessarily been drawn to scale. Further, it will be understood that several of the drawings have been drawn schematically and/or partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

High data reliability, high speed of memory access, lower power consumption, and reduced chip size are features that are demanded from semiconductor memory. In recent years, three-dimensional (3D) memory devices have been introduced. Some 3D memory devices are formed by stacking memory dies vertically and interconnecting the dies using through-silicon (or through-substrate) vias (TSVs). Benefits of the 3D memory devices include shorter interconnects (which reduce circuit delays and power consumption), a large number of vertical vias between layers (which allow wide bandwidth buses between functional blocks, such as memory dies, in different layers), and a considerably smaller footprint. Thus, the 3D memory devices contribute to higher memory access speed, lower power consumption, and chip size reduction. Example 3D memory devices include Hybrid Memory Cube (HMC) and High Bandwidth Memory (HBM). For example, HBM is a type of memory that includes a vertical stack of DRAM dies and an interface die (which, e.g., provides the interface between the DRAM dies of the HBM device and a host device).

In a system-in-package (SiP) configuration, HBM devices may be integrated with a host device (e.g., a graphics processing unit (GPU) and/or central processing unit (CPU)) using a base substrate (e.g., a silicon interposer, a substrate of organic material, a substrate of inorganic material and/or any other suitable material that provides interconnection between the GPU/CPU and the HBM device and/or provides mechanical support for the components of a SiP device) through which the HBM devices and host communicate. Because traffic between the HBM devices and host device resides within the SiP (e.g., using signals routed through the silicon interposer), a higher bandwidth may be achieved between the HBM devices and host device than in conventional systems. In other words, the TSVs interconnecting DRAM dies within an HBM device, and the silicon interposer integrating HBM devices and a host device, enable the routing of a greater number of signals (e.g., wider data buses) than is typically found between packaged memory devices and a host device (e.g., through a printed circuit board (PCB)). The high bandwidth interface within a SiP enables large amounts of data to move quickly between the host device (e.g., GPU/CPU) and HBM devices during operation. For example, the high bandwidth channels can be on the order of 1,000 gigabytes per second (GB/s; sometimes also referred to as gigabits (Gb)). It will be appreciated that such high bandwidth data transfer between a GPU/CPU and the memory of HBM devices can be advantageous in various high-performance computing applications, such as video rendering, high-resolution graphics applications, artificial intelligence and/or machine learning (AI/ML) computing systems and other complex computational systems, and/or various other computing applications.

Although a SiP configuration provides certain improvements (e.g., in the form of increased bandwidth between the host device and HBM devices integrated therein), it may still suffer from various shortcomings. For example, in a conventional SiP executing a computing application, the host device typically needs to retrieve data from the HBM device in order to process the data (e.g., perform one or more operations on the data). Furthermore, the host device typically transfers the processed data back to the HBM device (e.g., for storing). This data movement between the host device and HBM device can cause delays (thereby limiting the computing application improvements expected from increased bandwidth within the SiP) and/or consume a significant amount of power.

One proposed solution to address the above-describing shortcomings is the use of processing-in-memory (PIM). In a PIM architecture, memory devices include circuitry to perform data processing (e.g., logical operations, arithmetic operations, etc.) on the memory devices' contents. Whereas a conventional host device may send commands to a memory device to read data from and/or write data to a specified location within the memory device (so that operations can be performed within the host device), a host device utilizing a PIM architecture may additionally send commands to the memory device instructing the memory device to perform specified operations (e.g., add, multiply, etc.) on data at specified locations within the memory device and store the results to a further specified memory device location. As a result, operations can be performed on data, directly within the memory device, without needing to move the data between the memory device and the host device.

Existing implementations of PIM architectures, however, suffer from other shortcomings. Some implementations include PIM circuitry (e.g., circuits that perform processing, circuits that control processing, circuits that sequence through instructions controlling processing, etc.) within the memory dies themselves, which can create various challenges. For example, the size of the memory dies may need to be increased to accommodate the additional PIM circuitry. As a further example, the amount of storage provided by each memory die may be reduced to accommodate the additional PIM circuitry (e.g., a memory die with PIM circuitry may maintain die size by reducing the number of memory banks on the die). As a still further example, the inclusion of PIM circuitry within the memory die (e.g., near the memory array banks) can interfere with the array functionality and introduce noise, delay, and other complexities into the array's design, which can result in reduced memory die speed. It will be appreciated that including circuits to support PIM within the memory dies themselves (e.g., as part of and/or nearby the memory arrays) can create other shortcomings.

Accordingly, described herein are HBM devices and associated components of memory systems (e.g., host devices, memory controllers, and/or SiPs) that provide test circuitry-based PIM. As described herein, the HBM devices with test circuitry-based PIM use existing circuitry of the memory devices, such as circuitry used to control, sequence, and/or perform test functions, to perform aspects of PIM. By doing so, the overhead (e.g., additional circuitry within the memory device) to support PIM is reduced. Furthermore, as described herein, memory device components to perform PIM (e.g., circuits, logic, state, code, etc.) may be located in dies, outside of the memory dies, of the HBM devices with test circuitry-based PIM. For example, some of the PIM circuitry and/or code may be located on an interface die and/or other logic die of the HBM device with test circuitry-based PIM. As a result, the need to include functionality to support PIM within the DRAM dies of the HBM device (e.g., logic to perform processing, to sequence through steps, etc.) can be reduced or eliminated.

Some memory devices are required to support certain test functions in order to be compliant with applicable standards. For example, HBM devices that comply with the HBM3 specification issued by JEDEC (i.e., HBM3 devices) must support built-in self-test (BIST) features, such as memory BIST (mBIST). Memory devices that comply with other specifications (e.g., HBM4 devices) are also expected to support mBIST and/or other BIST features. As described herein, embodiments of HBM devices with test circuitry-based PIM may use portions of mBIST logic to perform aspects of PIM. For example, the mBIST logic of a memory device (e.g., an HBM device) may include an automatic pattern generator (APG), which may control mBIST operations of the memory device (e.g., generate test patterns, write test patterns to memory, read data from memory, compare the read data to the generated test patterns, and/or evaluate the location of memory faults based on the comparison). In embodiments, HBM devices with test circuitry-based PIM use the mBIST APG as a PIM sequencer.

As described herein, in embodiments of a HBM device with test circuitry-based PIM that uses the mBIST APG as a PIM sequencer, the mBIST APG can control PIM operations. For example, the PIM sequencer can receive and/or detect commands from a host device regarding the requested processing (e.g., what operation to perform, on what location within memory, etc.), fetch and decode instructions (e.g., from a ROM, RAM, etc.) that control how the processing is to be performed, issue read commands to memory dies to read data (e.g., source data) used for processing, control one or more processing units (PUs) within the memory device that perform the operations on the read data (e.g., execution units that perform logical and/or arithmetic operations), and/or issue write commands to memory dies to write result data (e.g., once processed by the PUs) back to the memory dies. Advantageously, by utilizing the mBIST APG as the PIM sequencer, embodiments of HBM devices with test circuitry-based PIM can make use of existing functionality found on non-memory dies and reduce or eliminate the need to include PIM sequencing functionality on memory dies. For example, the HBM device with test circuitry-based PIM can make use of the mBIST APG (required by the HBM specification) on the interface die or other logic die and reduce or eliminate the amount of additional circuitry or overhead on the memory dies of the HBM device.

As described herein, in embodiments of a HBM device with test circuitry-based PIM, the mBIST components of the memory device (e.g., the mBIST APG) can be programmed to enable various computational functions of PIM. That is, the mBIST APG may be capable of sequencing through and executing microcode instructions (e.g., stored in ROM, RAM, non-volatile memory such as flash memory, etc.) to perform PIM operations. The microcode instructions may be capable of providing program control (e.g., jump to a specified microcode location, increment and/or decrement counters used to represent loop boundaries, advance to the next sequential instruction, etc.). The microcode instructions may additionally be capable of interfacing with the memory dies of the memory device (e.g., precharge a row, active a row, read data, write data, etc.). The microcode instructions may instruct the memory device to perform (in combination with other components of the memory device, such as PIM sequencer and/or PUs) various computational functions, such as matrix multiplication, multiply-accumulate (MAC), and other operations used in neural networking and other types of operations. In some embodiments, a ROM used by mBIST to store microcode instructions includes microcode sequences to perform PIM operations. In some embodiments, a host device may write microcode instructions for desired PIM operations, over a data bus (e.g., PIM operations not supported by the microcode instructions in ROM), to a non-volatile memory (e.g., flash) used by mBIST.

A host device coupled to a HBM device with test circuitry-based PIM (e.g., integrated in a SiP) may issue commands to the memory device to request that it perform one or more PIM operations. In some embodiments, the host device can issue commands through a debug/test interface of the memory device. For example, the host device can issue commands to a direct access (DA) test port of the memory device using a protocol, such as defined by the Institute of Electrical and Electronics Engineers (IEEE) 1500 Standard for Embedded Core Test (SECT). In some embodiments, the DA test port and/or test circuitry of the memory device (e.g., mBIST, mBIST APG, etc.) support dedicated IEEE 1500 commands for PIM operations, such as neural network computations. In some embodiments, the host device can issue commands through a functional interface also used for conventional memory operations (e.g., reads and/or writes). For example, the host device can issue commands through a command interface (e.g., a column command/address and/or row command/address interface). In response, whether the command is received by the memory device through, e.g., a DA test port or command/address interface, the memory device can perform the corresponding PIM operation accordingly. For example, the PIM sequencer may fetch microcode instructions from one location corresponding to a first command and may fetch microcode instructions from a second location corresponding to a first command (e.g., in response to a command to perform a neural network operation, the PIM sequencer may fetch microcode instructions from a location associated with that operation and fetch microcode instructions from a location associated with a MAC operation in response to receiving a command to perform a MAC).

The HBM device with test circuitry-based PIM may include one or more PUs used to perform operations (e.g., logical, arithmetic, etc.) on data during PIM operations. The one or more PUs can be configured to perform one or more of various operations, including logical functions (e.g., AND, OR, NAND, NOR, XOR, INVERT, etc.), arithmetic functions (e.g., add, subtract, multiply, etc.), MAC, neural network operations, etc. The PUs may operate in response to control signals and/or commands received from a PIM sequencer (which, in some embodiments, is provided by an mBIST APG), where the PIM sequencer generates the control signals and/or commands based on decoded microcode instructions (as described herein).

In some embodiments, one or more PUs are located on the interface die, or other logical die, of an HBM device with test circuitry-based PIM. In said embodiments, a PIM sequencer on the interface die may issue commands to read data from the DRAM dies, receive the read data at the interface die, perform operations on the read data at the interface die using the one or more PUs, and issue commands to write the resulting data to the DRAM dies. Advantageously, in said embodiments, more DRAM die area may be used for storage since the PUs may be located on the interface die. In some embodiments, one or more PUs are located on the DRAM dies. In said embodiments, a PIM sequencer on the interface die may issue commands to read data from the DRAM dies, cause the PUs located at those DRAM dies to perform operations on the read data, and issue commands to write the resulting data to the DRAM dies. Advantageously, in said embodiments, read data does not need to move within the HBM device (e.g., from a DRAM die to an interface die) to be operated on, which can reduce the power consumed by a PIM operation while also leaving the HBM device's TSVs free for other data movement.

As described herein, utilizing test circuitry to perform PIM may provide various advantages. For example, in embodiments of a HBM device with test circuitry-based PIM, the mBIST components implemented on the interface die (e.g., mBIST circuitry, mBIST APG, etc.) may have full-speed access (read and write) to all of the DRAM dies forming the memory device. That is, the mBIST components are able to read data from and write data to the DRAM dies at the same speed of conventional operations. With the addition of PUs, the mBIST components as described herein (e.g., as a PIM sequencer) can access all data of the HBM device at full speed, perform various PIM operations, and store data back and therefore provide a capable PIM architecture. That is, and as described further herein, the test circuitry-based PIM can make use of the high bandwidth communication channels of a memory device (e.g., formed by TSVs) to utilize the full bandwidth of the device when performing PIM operations. Furthermore, as described herein, the PIM capabilities are achieved, in some embodiments, without requiring a PIM sequencer distinct from mBIST components (e.g., the mBIST APG).

Although embodiments of HBM devices with test circuitry-based PIM are described herein, it will be appreciated that other types of memory devices (e.g., non-HBM) with mBIST may implement test circuitry-based PIM. That is, other memory devices that include mBIST functionality, including an mBIST sequencer, that in combination with PUs can perform PIM operations. For example, double data rate (DDR) SDRAM devices, as well as other types of DRAM-based devices, may provide test circuitry-based PIM.

FIG. 1 is a schematic diagram illustrating an environment 100 that incorporates a high bandwidth memory device with test circuitry-based processing-in-memory, configured in accordance with an embodiment of the present technology. As illustrated in FIG. 1, the environment 100 includes a SiP device 110 having one or more host devices 120 (one illustrated in FIG. 1, sometimes also referred to herein as one or more "hosts") and one or more HBM devices 130 (one illustrated in FIG. 1), integrated with a silicon interposer 112 (or any other suitable base substrate). As described herein, the HBM devices 130 may be HBM devices with test circuitry-based PIM. The environment 100 additionally includes a storage device 140 coupled to the SiP device 110. The host devices 120 can include one or more CPUs and/or one or more GPUs (referred to as CPU/GPU 122), each of which may include registers 124 and a first level of cache 126. The first level of cache 126 (also referred to herein as "L1 cache") is communicatively coupled to a second level of cache 128 (also referred to herein as "L2 cache") via a first communication path 152. In the illustrated embodiment, the L2 cache 128 is incorporated into the host devices 120. However, it will be understood that the L2 cache 128 can be integrated into the CPU/GPU 122 and/or SiP device 110 separate from the host devices 120. Purely by way of example, the host devices 120 can be carried by a base substrate (e.g., the silicon interposer 112, a package substrate carrying the silicon interposer 112, another suitable organic substrate, an inorganic substrate, and/or any other suitable material) adjacent to the L2 cache 128 and in communication with the L2 cache 128 via one or more signal lines (or other suitable signal route lines) therein. The L2 cache 128 may be shared by one or more of the host devices 120 (and the CPU/GPU 122 therein). During operation of the SiP device 110, the CPU/GPU 122 can use the registers 124 and the L1 cache 126 to complete processing operations and attempt to retrieve data from the larger L2 cache 128 whenever a cache miss occurs in the L1 cache 126. As a result, the multiple levels of cache can help accelerate the average time it takes for the host devices 120 to access data, thereby accelerating the overall processing rates.

As further illustrated in FIG. 1, the L2 cache 128 is communicatively coupled to the HBM devices 130 through a second communication channel 154. As illustrated, the host devices 120 and HBM devices 130 are carried by and electrically coupled to (e.g., integrated by) the silicon interposer 112. The second communication channel 154 is provided by the silicon interposer 112 (e.g., the silicon interposer includes and routes the interface signals forming the second communication channel, such as through one or more redistribution layers (RDLs)). As additionally illustrated in FIG. 1, the L2 cache 128 is also communicatively coupled to a storage device 140 through a third communication channel 156. As illustrated, the storage device 140 is outside of the SiP device 110 and utilizes signal routing components that are not contained within the silicon interposer 112 (e.g., between a packaged SiP device 110 and packaged storage device 140). For example, the third communication channel 156 may be a peripheral bus used to connect components on a motherboard or PCB, such as a Peripheral Component Interconnect Express (PCIe) bus. As a result, during the operation of the SiP device 110, the host devices 120 can read data from and/or write data to the HBM devices 130 and/or the storage device 140 through the L2 cache 128.

In the illustrated environment 100, the HBM devices 130 include an interface die 132 and one or more stacked memory dies 134 (e.g., DRAM dies, one illustrated schematically in FIG. 1) coupled to the second communication channel 154. As explained above, the HBM devices 130 can be located on the silicon interposer 112, on which the host devices 120 are also located. As a result, the second communication channel 154 can provide a high bandwidth (e.g., on the order of 1,000 GB/s) channel, through the silicon interposer 112, between the host devices 120 and HBM devices 130. Further, as explained above, each of the HBM devices 130 can provide a high bandwidth channel, internally (not shown), between interface die 132 and/or the memory dies 134 therein. As a result, data can be communicated between the host devices 120 and the HBM devices 130 (and components thereof) at high speeds, which can be advantageous for data-intensive processing operations. Purely by way of example, the interface die 132 can be a logic die that receives various read/write requests from the host devices 120, reads/writes to the memory dies 134 in response to the requests, performs any necessary processing, and responds to the host devices 120. During operations between the host devices 120 and HBM devices 130 therein, the SiP device 110 uses a high bandwidth communication channel.

One or more of the HBM devices 130 may be a high bandwidth memory device with test circuitry-based processing-in-memory. That is, in addition to performing read/write operations, the HBM devices 130 can perform one or more processing operations (e.g., logical, arithmetic, neural network calculations, etc.) on stored data in response to requests from the host devices 120. In some embodiments, one or more aspects of the PIM operations may be carried out on the interface die 132, memory dies 134, and/or other logical dies (not shown) of the HBM devices 130. For example, in some embodiments the PIM operations may be controlled by a PIM sequencer (not shown) located on the interface die 132. In said embodiments, the PIM sequencer may be implemented using test circuitry found on the interface die 132, such as mBIST circuitry and/or an mBIST APG. As a further example, in some embodiments the PIM operations may be performed by PUs (not shown) located on the interface die 132. In still further examples, in some embodiments the PIM operations may be performed by PUs (not shown) located on the memory dies 134. As described herein, PIM operations within an HBM device 130 may be carried out using the internal high bandwidth channel of the HBM device (e.g., using TSVs of the HBM device (not shown)). That is, for example, in some embodiments a PIM sequencer on an interface die 132 may issue a command to read data from one or more memory dies 134, receive the read data over the internal high bandwidth channel, perform one or more operations on the read data using PUs located on the interface die, and send the resultant data to the one or more memory dies over the internal high bandwidth channel to be written.

Figure 2:
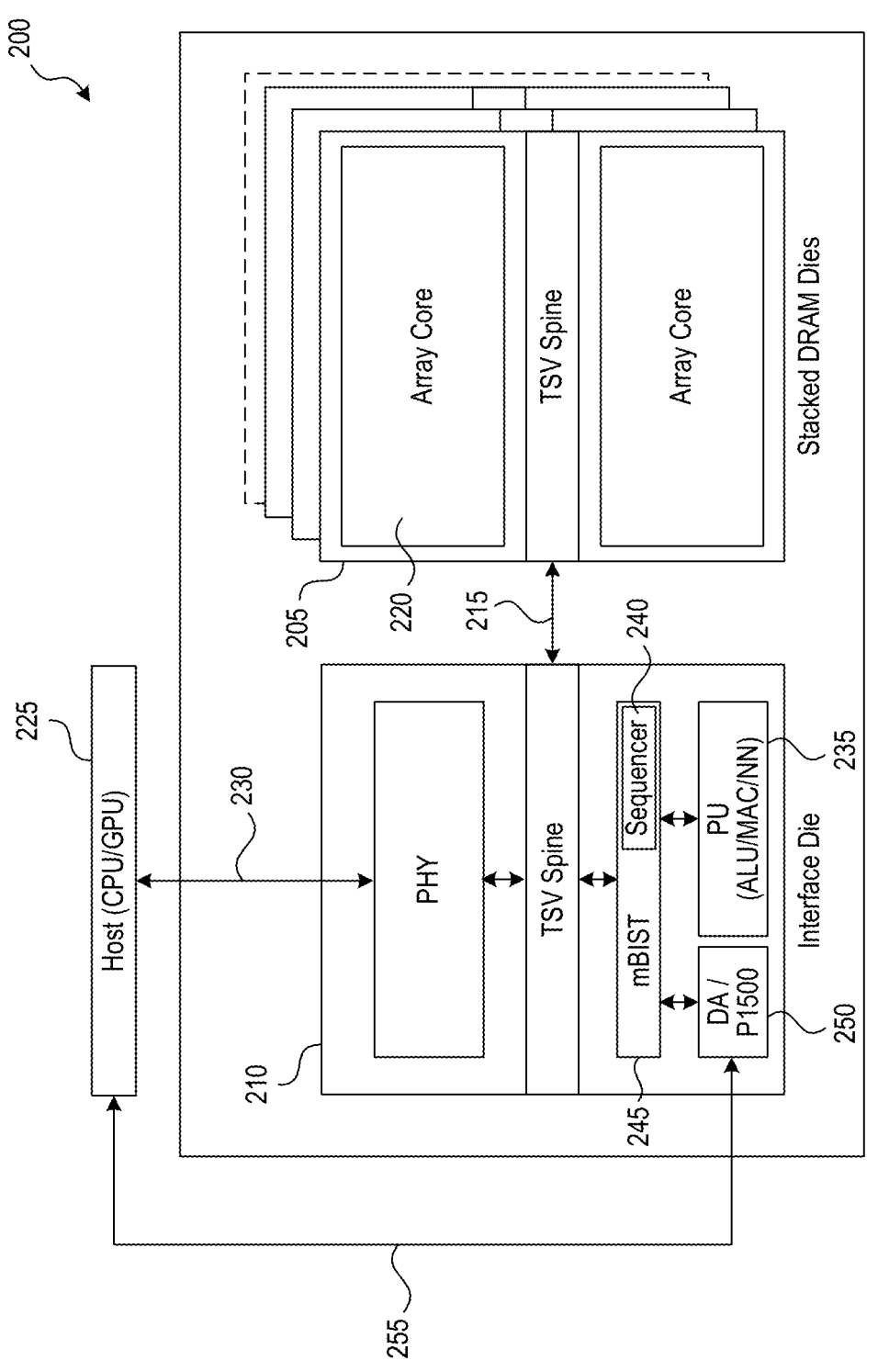
FIG. 2 is a simplified block diagram schematically illustrating a high bandwidth memory device with test circuitry-based processing-in-memory, configured in accordance with an embodiment of the present technology.

FIG. 2 is a simplified block diagram schematically illustrating an HBM device 200 with test circuitry-based processing-in-memory, configured in accordance with an embodiment of the present technology. The HBM device 200 includes a stack of multiple DRAM dies 205 (three shown in the embodiment illustrated in FIG. 2) and an interface die 210. The DRAM dies 205 and interface die 210 are interconnected by TSVs 215, which provide a high bandwidth communication channel within the HBM device 200.

Each DRAM die 205 includes one or more memory arrays 220 (e.g., DRAM arrays) capable of storing information. In the embodiment illustrated in FIG. 2, each DRAM die 205 includes two memory arrays 220. For example, as illustrated in FIG. 2, each DRAM 205 includes memory arrays 220 on either side of a TSV spine. A host 225 (e.g., a CPU and/or GPU) can access the memory arrays 220 of the DRAM dies 205 (e.g., write data to and/or read data from the memory arrays) by issuing commands (e.g., write commands and/or read commands) to the interface die 210 over a memory interface 230. The memory interface 230 may include a command bus (over which the host 225 can send commands, such as read commands and/or write commands), an address bus (over which the host can send address information associated with the command, such as storage location to which data should be written or from which data should be read), and/or a bidirectional data bus over which data can be transmitted by the host (e.g., associated with a write command) or the HBM device 200 (e.g., in response to a read command).

The HBM device 200 additionally supports processing-in-memory, in which various operations can be performed on data stored in the HBM device and the results of those operations written back to the HBM device without the data leaving the HBM device (e.g., to be operated on by the host 225). As illustrated in FIG. 2, the interface die 210 of the HBM device 200 includes one or more PUs 235 (one shown in the embodiment illustrated in FIG. 2). As described herein, the PUs 235 can be capable of performing various operations on input data. For example, as illustrated in FIG.

2, the PUs 235 can include execution circuitry to perform arithmetic logic unit (ALU) operations, MAC operations, and/or neural network operations. The PUs 235 can perform the operations on input data read from the memory arrays 220 of the DRAM dies 205 to generate result data that can be written back to the memory arrays of the memory dies.

A PIM sequencer 240 can control the PIM operations of the HBM device 200. For example, the PIM sequencer 240 can fetch and decode a sequence of microcode instructions that include programming to perform one or more PIM operations. In response to decoding the microcode instructions, the PIM sequencer 240 can send commands, through the high bandwidth communication channel formed by the TSVs 215, to the memory dies 205, including commands to read data from the memory dies (e.g., input data to be operated on) and/or commands to write data to the memory dies (e.g., output data generated by the operations to be saved). It will be appreciated that by using the high bandwidth communication channel formed by the TSVs 215, the PIM sequencer 240 is able to utilize the full bandwidth of the HBM device 200 to access all data internal to the HBM device. The PIM sequencer 240 can additionally send commands and/or control signals to the PUs 235 to control their operations (e.g., to enable a particular type of operation). Although the PIM sequencer 240 is described as using microcode instructions (e.g., stored in ROM, RAM, flash, etc.), embodiments of the PIM sequencer can use additional mechanisms (e.g., hardware-implemented state machines) for various aspects of program control.

As illustrated in FIG. 2, the PIM sequencer 240 can be part of the test logic of the interface die 210, such as mBIST logic 245. In some embodiments, the PIM sequencer 240 is implemented (in whole or in part) using an mBIST APG (not shown) within the mBIST logic 245. That is, in said embodiments the mBIST APG can be configured to decode microcode instructions and issue commands and/or control signals to other components of the HBM device 200 (e.g., memory dies 205 and/or PUs 235) to perform PIM operations.

The host 225 can issue commands to the HBM device 200 to instruct the HBM device to perform PIM operations. In some embodiments, the host 225 can send a PIM command to a DA test port 250 of the HBM device 200 through a sideband channel 255. As illustrated in FIG. 2, the DA test port 250 can support a standardized test protocol, such as IEEE 1500 SECT. For example, the host 225 may send a PIM command over the sideband channel 255 to the DA test port 250, which the HBM device 200 and/or mBIST logic 245 may recognize as a command to initiate PIM operations (instead of initiating a test mode), and respond accordingly. In some embodiments, the host 225 can send a PIM command to the HBM device 200 using the memory interface 230. For example, the host 225 may send a command requesting a particular type of PIM operation over a command bus portion of the memory interface 230 and/or send the memory address of input data over an address portion of the memory interface. Based on the detected command (e.g., received over the memory interface 230 or from the DA test port 250), the PIM sequencer 240 may perform the requested PIM operation (e.g., begin fetching a sequence of microcode associated with the requested operation). In some embodiments, the host 225 may write PIM microcode to the HBM device 200 using the memory interface 230. For example, the host 225 may send a microcode write command over a command portion of the memory interface 230 and the PIM microcode over a data bus portion of the memory interface. Based on the received command, the PIM sequencer 240 may store the received PIM microcode to a writable area of memory (e.g., RAM, flash, etc.) from which the PIM sequencer can later fetch and decode the instructions.

Although FIG. 2 illustrates an embodiment of the HBM device 200 in which the PUs 235 and PIM sequencer 240 are located on the interface die 210 of the HBM device, in some embodiments the PUs and/or PIM sequencer can be located on other logic dies of the HBM device. Additionally, in some embodiments at least some of the PUs 235 are located on at least some of the DRAM dies 205 of the HBM device 200.

Figure 3:
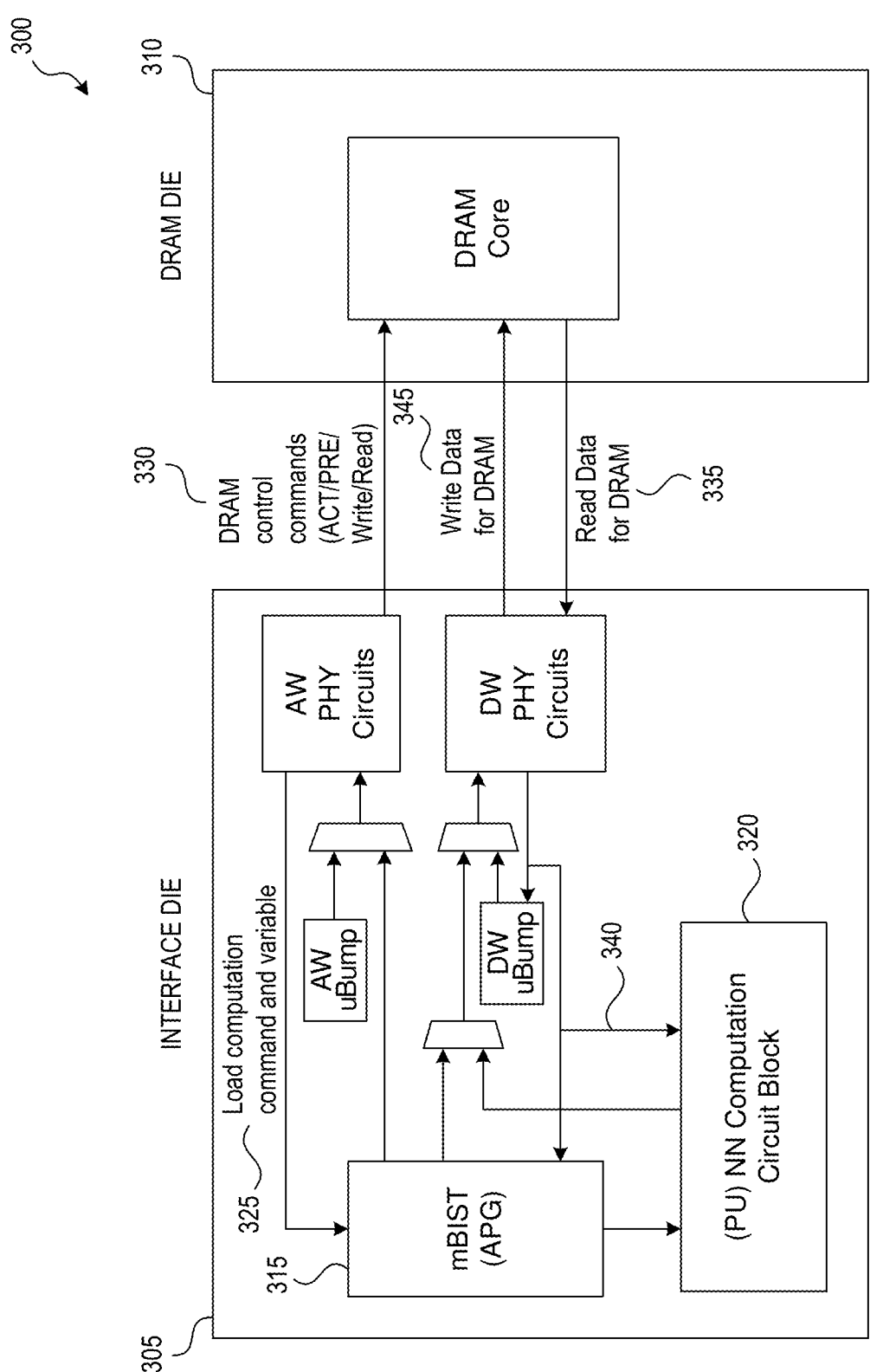
FIG. 3 is a simplified block diagram schematically illustrating a dataflow between an interface die and memory die of a high bandwidth memory device with test circuitry-based processing-in-memory, configured in accordance with an embodiment of the present technology.

FIG. 3 is a simplified block diagram schematically illustrating a dataflow 300 between an interface die 305 and a memory die 310 of a HBM device with test circuitry-based processing-in-memory, configured in accordance with an embodiment of the present technology. In the embodiment of the HBM device illustrated in FIG. 3, PIM operations of the HBM device are controlled by mBIST logic 315 (e.g., an mBIST APG) of the interface die 305 (that is, the mBIST logic, such as the mBIST APG, operates as a PIM sequencer), and the PU 320 (e.g., a neural network computation circuit block) is located on the interface die 305.

At a step 325, a computation command and/or variables associated with the computation command may be loaded into the mBIST logic 315. The computation command and/or variables may be loaded into the mBIST logic 315 by a host device (not shown) using an interface of the logic die (e.g., PHY circuits). The computation command may indicate the type of computation the host device is requesting be performed by the HBM device. The variables may include parameters used for the computation, including the addresses in memory of source and destination data, the number of computation cycles, loop boundaries, etc.

At step 330, the interface die 305 transmits DRAM commands to the memory die 310. The DRAM commands can include read commands and/or commands to prepare the memory die 310 for memory access (e.g., activate and/or precharge commands). The mBIST logic 315 may generate the DRAM commands to read data from the memory die 310 based on the computation command and/or variables loaded at step 325.

At step 335, data is read from the memory die 310 and into the interface die 305. At step 340, the read data is received by PU 320 of the interface die 305 (e.g., using one or more data paths of the interface die), and the PU operates on the data. As illustrated in FIG. 3, the PU 320 can additionally receive control signals from the mBIST logic 315, which can control the operations to be performed by the PU on the read data.

At step 345, the interface die 305 transmits the data, processed by the PU 320, to the memory die 310 for writing to memory. The interface die 305 may also transmit one or more commands (not shown) to the memory die 310 to request the write.

It will be appreciated that in the dataflow 300 illustrated in FIG. 3, computations are performed within the interface die 305 using a PU 320 located on the die, therefore reducing the impact to the memory die 310 (e.g., no PU needs to be located on the memory die). However, data to be operated on needs to be passed between the memory die 310 and interface die 305, thereby occupying the internal high bandwidth communication bus of the HBM device (e.g., provided by TSVs) during data movement of a PIM operation.

Figure 4:
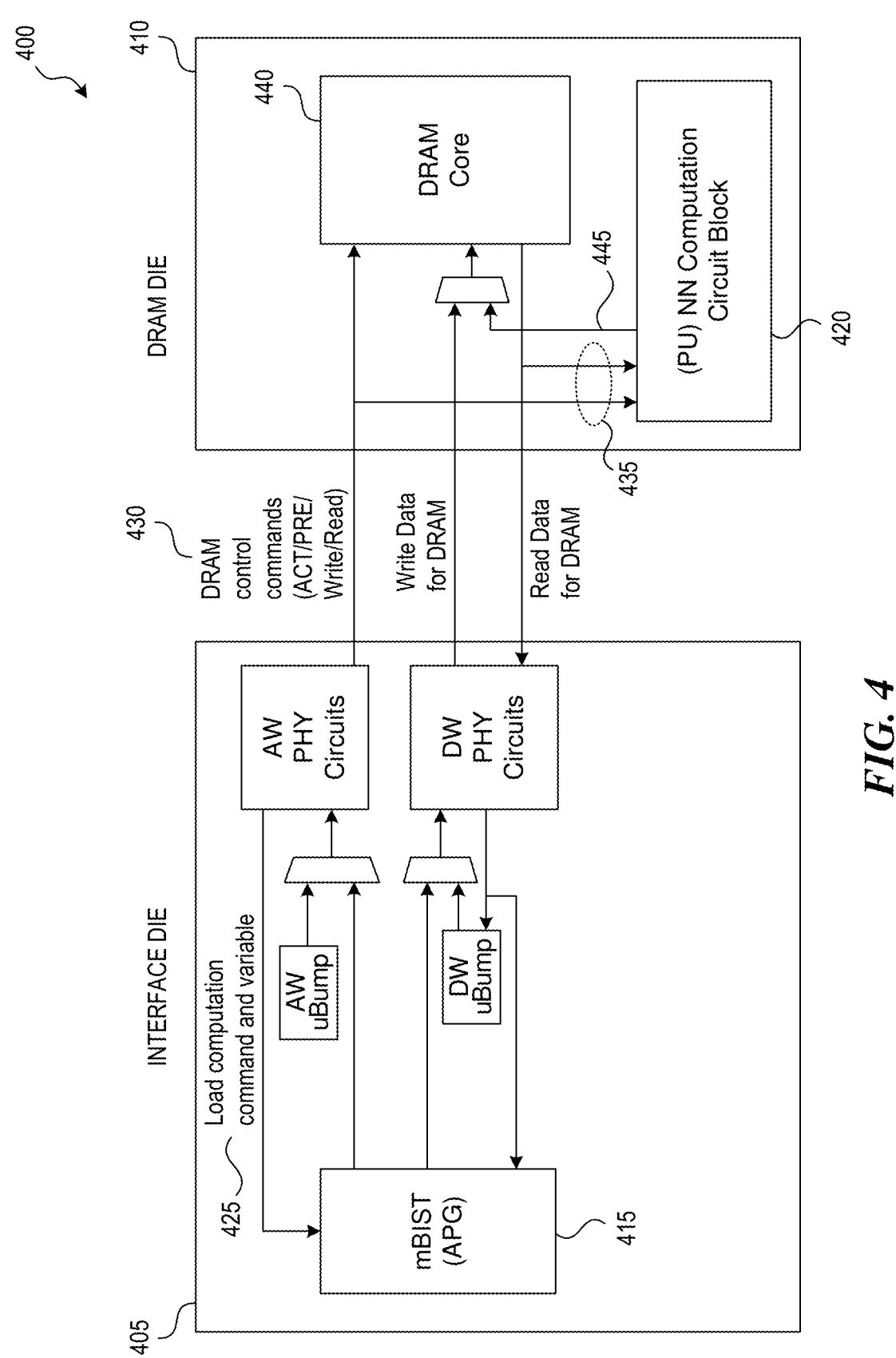
FIG. 4 is a simplified block diagram schematically illustrating a further dataflow between an interface die and memory die of a high bandwidth memory device with test circuitry-based processing-in-memory, configured in accordance with an embodiment of the present technology.

FIG. 4 is a simplified block diagram schematically illustrating a further dataflow 400 between an interface die 405 and memory die 410 of a high bandwidth memory device with test circuitry-based processing-in-memory, configured in accordance with an embodiment of the present technology. In the embodiment of the HBM device illustrated in FIG. 4, PIM operations of the HBM device are controlled by mBIST logic 415 (e.g., an mBIST APG) of the interface die 405 (that is, the mBIST logic, such as the mBIST APG, operates as a PIM sequencer). Further, in the embodiment of the HBM device illustrated in FIG. 4, PIM operations are performed by a PU 420 (e.g., a neural network computation circuit block) located on the memory die 410.

At a step 425, a computation command and/or variables associated with the computation command may be loaded into the mBIST logic 415. The computation command and/or variables may be loaded into the mBIST logic 415 by a host device (not shown) using an interface of the logic die (e.g., PHY circuits). The computation command may indicate the type of computation the host device is requesting be performed by the HBM device. The variables may include parameters used for the computation, including the addresses in memory of source and destination data, the number of computation cycles, loop boundaries, etc.

At step 430, the interface die 405 transmits DRAM commands to the memory die 410. The DRAM commands can include read commands and/or commands to prepare the memory die 410 for memory access (e.g., activate and/or precharge commands). The DRAM commands can additionally include commands to perform PIM operations, such as routing read data within the memory die 410 to the PU 420, controlling operation of the PU, etc. The mBIST logic 415 may generate the DRAM commands to read data from the memory die 410 and cause the read data to be routed to the PU 420 (internally to the memory die) for processing based on the computation command and/or variables loaded at step 425.

At step 435, the PU 420 receives the read data and operates on the data. As illustrated in FIG. 4, the PU 420 receives the data from a DRAM core 440 of the memory die 410 without the data leaving the memory die. That is, the data, once read (as commanded by the mBIST logic 415), is routed internally within the memory die 410 to the PU 420. As further illustrated in FIG. 4, the PU 420 can additionally receive control signals (e.g., from the DRAM commands), which can control the operations performed by the PU on the read data.

At step 445, the PU 420 transmits the data, processed by the PU 420, to the DRAM core 440 for writing to memory.

It will be appreciated that, in the dataflow 400 illustrated in FIG. 4, computations are performed within the memory die 410 using a PU 420 located on the die, thereby reducing the amount of data that needs to be passed between the memory die and interface die 405. As a result, the internal high bandwidth communication bus of the HBM device (e.g., provided by TSVs) is available for other operations (e.g., read and/or write operations requested by a host).

Figure 5:
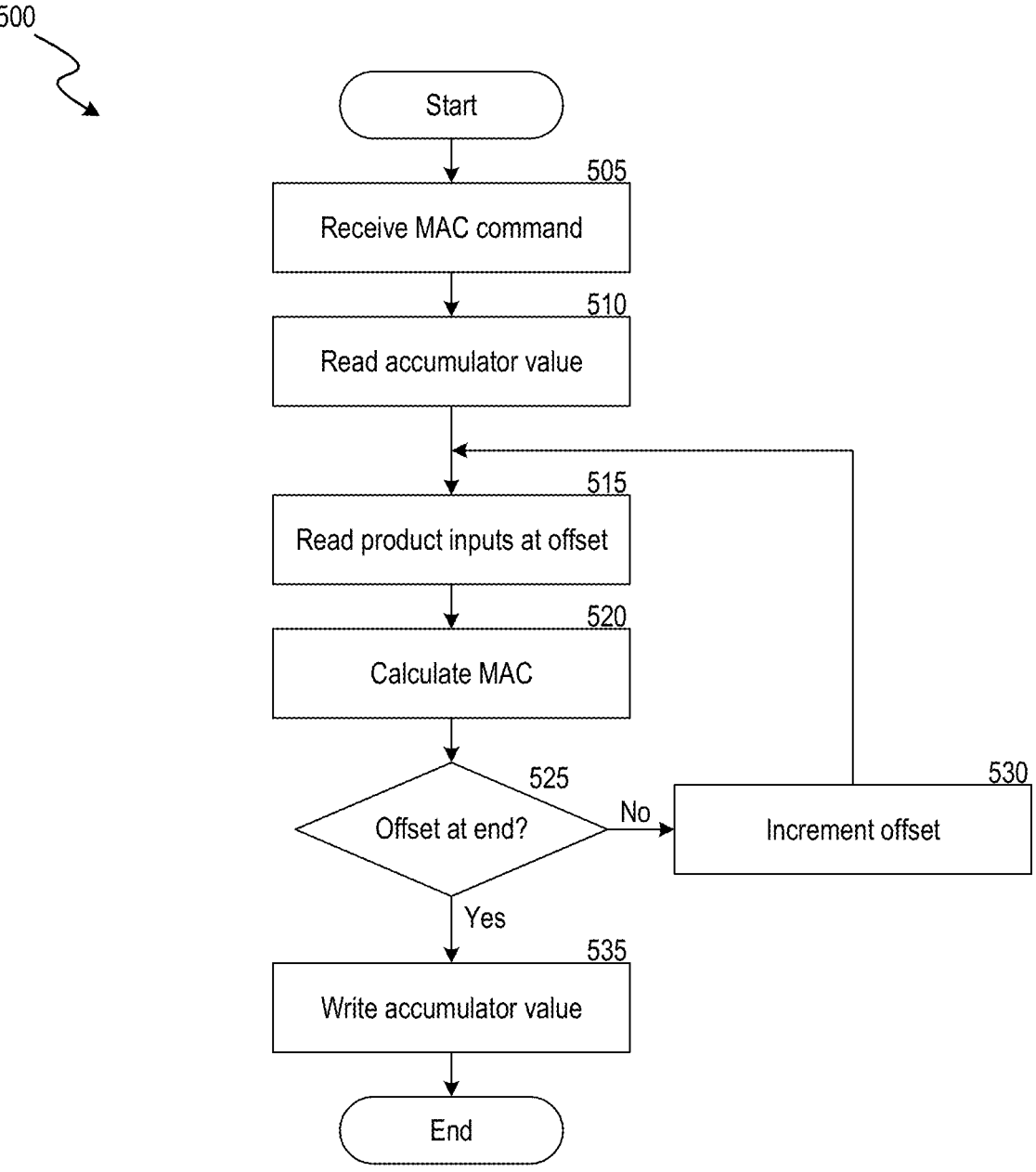
FIG. 5 is a flow diagram illustrating a process for performing a multiply-accumulate operation in a high bandwidth memory device with test circuitry-based processing-in-memory, configured in accordance with an embodiment of the present technology.

FIG. 5 is a flow diagram illustrating a process 500 for performing a MAC operation in a HBM device with test circuitry-based processing-in-memory, configured in accordance with an embodiment of the present technology.

The process 500 begins at block 505, where the HBM device receives a command (e.g., from a host) to perform a MAC operation. A MAC operation calculates the product of two values and adds the product to an accumulator (e.g., it performs the operation a=a+(b×c)). The command includes various parameters to perform the MAC operation. For example, the command can include the memory address of the accumulator value a, and the memory addresses of the two values to be multiplied, b and c. In some embodiments, a, b, and/or c are vectors of elements. In said embodiments, the addresses included in the command may be a starting address (e.g., the address of the first element in the vector), and the command may also include a vector size (e.g., how many elements are in the vector).

At block 510, the HBM device reads the accumulator value a from memory. To do so, a PIM sequencer (e.g., an mBIST APG) of the HBM device may generate one or more commands to memory dies of the HBM device. For example, the PIM sequencer can generate commands to activate the memory array locations in which the accumulator value a is located (based on information from the received MAC command) and read the accumulator value a from those locations.

At block 515, the HBM device reads the values b and c from memory. To do so, the PIM sequencer of the HBM device may generate one or more commands to memory dies of the HBM device. In embodiments in which b and c are vectors of elements, the PIM sequencer may generate commands to read from memory locations corresponding to a current offset of the vectors. For example, the offset may be initialized to 0 (e.g., to read from the first element at the starting address provided by the host) and, as described herein, may be incremented during successive iterations.

At block 520, the HBM device calculates the value of a+(b×c). The calculation may be performed by a PU located on an interface die and/or memory die of the HBM device.

At decision block 525, the HBM device determines whether it has reached the end of MAC operations. For example, if b and c are vectors of elements, the HBM device may determine whether the current offset indicates that the MAC operation has been performed on the last elements of the vector. The determination may be made, for example, by the mBIST APG. If the HBM device determines it has not reached the end of MAC operations, the process continues to block 530. If the HBM device determines it has reached the end of MAC operations, the process continues to block 535.

At block 530, the HBM device increments the current offset. For example, the mBIST APG may adjust an offset value to reflect the next location, in memory, of the next element in the vectors. The process then returns to block 515 to read values of b and c from the new offset.

At block 535, the HBM device writes the result of the MAC operations to the memory location of the accumulator value a. The process 500 then ends.

Although FIG. 5 illustrates a process 500 for performing MAC, it will be appreciated that the HBM device with test circuitry-based PIM can be used to perform other operations.

Figure 6:
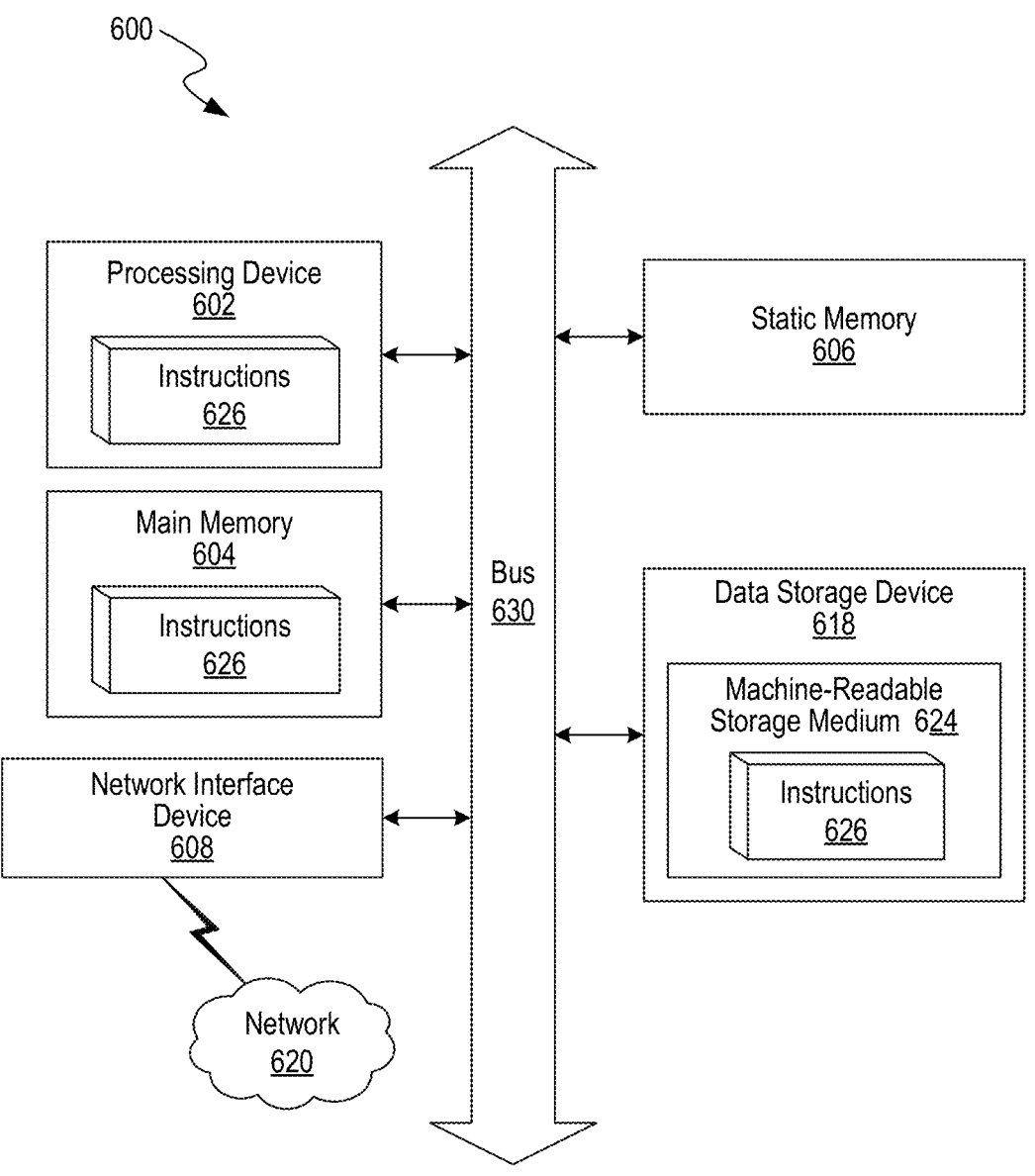
FIG. 6 is a block diagram of an example computer system in accordance with an embodiment of the present technology.

FIG. 6 illustrates the block diagram of an example machine of a computer system 600 within which a set of instructions for causing the machine to perform any one or more of the methodologies discussed herein can be executed. In alternative embodiments, the machine can be connected (e.g., networked) to other machines in a LAN, an intranet, an extranet, and/or the internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer, a tablet computer, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or Rambus DRAM (RDRAM), etc.), a static memory 606 (e.g., flash memory, static RAM (SRAM), etc.), and a data storage device 618, which communicate with each other via a bus 630. In accordance with one aspect of the present disclosure, the main memory 604 can perform (e.g., in response to requests from the processing device 602) processing-in-memory using test circuitry of the main memory.

The processing device 602 represents one or more general-purpose processing devices such as a microprocessor, a CPU, or the like. More particularly, the processing device can be a complex instruction set computing (CISC) microprocessor, a reduced instruction set computing (RISC) microprocessor, a very long instruction word (VLIW) microprocessor, a processor implementing other instruction sets, or a processor implementing a combination of instruction sets. The processing device 602 can also be one or more special-purpose processing devices such as an application-specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over the network 620.

The data storage device 618 can include a machine-readable storage medium 624 (also known as a computer-readable medium) on which are stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media.

While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine, which instructions cause the machine to perform any one or more of the methodologies of the present disclosure. The term "machine-readable storage medium" shall accordingly be taken to include, but not be limited to, solid-state memories, optical media, and magnetic media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate or subregions of the substrate may be controlled through doping using various chemical species including, but not limited to, phosphorus, boron, or arsenic. Doping may be performed during the initial formation or growth of the substrate, by ion implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, that the operations and the steps may be rearranged or otherwise modified, and that other implementations are possible. Furthermore, embodiments from two or more of the methods may be combined.

From the foregoing, it will be appreciated that specific embodiments of the invention have been described herein for purposes of illustration but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods, in addition to those specific embodiments disclosed herein, may be within the scope of the present technology.

We claim:

1. A high bandwidth memory (HBM) device comprising:
a plurality of vertically stacked memory dies, each of the memory dies comprising a memory array;
a processing unit (PU) configured to perform an arithmetic or logical operation; and
an interface die, the interface die comprising a memory built-in self-test (mBIST) circuit, wherein the mBIST circuit is configured to:

detect a command to perform a processing-in-memory (PIM) operation;

generate, in response to the detected command, a read command causing a first memory die, of the plurality of memory dies, to read data from the memory array;

configure the PU to perform the arithmetic or logical operation on the read data to generate a result; and generate a write command causing a second memory die, of the plurality of memory dies, to write the result data to the memory array.

2. The HBM device of claim 1, wherein the mBIST circuit is an mBIST automatic pattern generator (APG).

3. The HBM device of claim 1, wherein the command to perform the PIM operation comprises an operation type, a source data address, and a destination address.

4. The HBM device of claim 1, wherein the mBIST circuit is further configured to:

fetch a microcode instruction; and decode the microcode instruction, wherein configuring the PU to perform the arithmetic or logical operation is based on the decoded microcode instruction.

5. The HBM device of claim 4, the HBM device further comprising a read-only memory (ROM), wherein the mBIST circuit fetches the microcode instruction from the ROM.

6. The HBM device of claim 4, the HBM device further comprising a non-volatile memory, wherein the mBIST circuit fetches the microcode instruction from the non-volatile memory.

7. The HBM device of claim 6, wherein the HBM device is configured to:

receive, over an interface coupled to a host device, microcode programming; and store the microcode programming to the non-volatile memory, wherein the microcode programming is used by the mBIST circuit during a PIM operation.

8. The HBM device of claim 1, wherein the interface die further comprises a direct access (DA) interface, and wherein detecting a command to perform a PIM operation comprises detecting a PIM command on the DA interface.

9. The HBM device of claim 8, wherein the DA interface implements the Institute of Electrical and Electronics Engineers (IEEE) 1500 Standard for Embedded Core Test (SECT).

10. The HBM device of claim 1, wherein the first memory die further comprises the PU.

11. The HBM device of claim 10, wherein the read command causes the first memory die to transmit the read data to the PU without the read data leaving the first memory die.

12. The HBM device of claim 1, wherein the interface die further comprises the PU.

13. The HBM device of claim 12, wherein the interface die is further configured to:

receive the read data;

provide the read data to the PU; and transmit the result data to the second memory die.

14. The HBM device of claim 1, wherein the mBIST circuit has full speed access to the plurality of memory dies.

15. The HBM device of claim 1, wherein the first memory die and the second memory die are different memory dies.

16. The HBM device of claim 1, wherein the mBIST circuit is further configured to:

generate, in response to the detected command, a second read command causing a third memory die to read data from the memory array, wherein the PU is configured to perform the arithmetic or logical operation on the read data and the second read data.

17. The HBM device of claim 1, wherein the operation performed by the PU is a multiply-accumulate (MAC).

18. A system-in-package (SiP) device, comprising:

an interposer substrate;

a host device carried by the interposer substrate; and a high bandwidth memory (HBM) device carried by the interposer substrate, wherein the HBM device is coupled to the host device by an interposer bus, and wherein the HBM device comprises:

an interface die carried by the interposer substrate, the interface die comprising a memory built-in self-test (mBIST) circuit; and a plurality of memory dies carried by the interface die, wherein the plurality of memory dies is communicably coupled to the interface die, wherein the mBIST circuit is configured to:

detect a command, received over the interposer bus from the host device, to perform a processing-in-memory (PIM) operation;

read data, from one of the plurality of memory dies, in response to the detected command;

configure a processing unit (PU) of the HBM device to perform an arithmetic or logical operation on the read data to generate a result; and write the result data to one of the plurality of memory dies.

19. A method comprising:

receiving, at a memory device, a request to perform a multiply-accumulate (MAC) operation on data stored in the memory device;

generating, at a memory built-in self-test (mBIST) automatic pattern generator (APG) of the memory device, a command to read the data stored in the memory device;

generating, at the mBIST APG, a command for a processing unit (PU) of the memory device to perform a MAC operation on the read data; and generating, at the mBIST APG, a command to write result data generated by the PU operation to a memory location of the memory device.

20. The method of claim 19, wherein the memory device is a double data rate (DDR) synchronous dynamic random access memory (RAM).

* * * * *